US009089062B2

(12) United States Patent
Janssen

(10) Patent No.: US 9,089,062 B2
(45) Date of Patent: Jul. 21, 2015

(54) METHOD FOR ELECTROLESS NICKEL-PHOSPHOROUS ALLOY DEPOSITION ONTO FLEXIBLE SUBSTRATES

(71) Applicant: Atotech Deutschland GmbH, Berlin (DE)

(72) Inventor: Boris Alexander Janssen, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 14/368,878

(22) PCT Filed: Jan. 21, 2013

(86) PCT No.: PCT/EP2013/051060
§ 371 (c)(1),
(2) Date: Jun. 26, 2014

(87) PCT Pub. No.: WO2013/120660
PCT Pub. Date: Aug. 22, 2013

(65) Prior Publication Data
US 2015/0009638 A1 Jan. 8, 2015

(30) Foreign Application Priority Data

Feb. 16, 2012 (EP) .................................... 12155801

(51) Int. Cl.
*B05D 5/12* (2006.01)
*H05K 1/09* (2006.01)
*C23C 18/16* (2006.01)
*C23C 18/36* (2006.01)
*H05K 3/24* (2006.01)
*C23C 18/50* (2006.01)
*H05K 1/02* (2006.01)
*H05K 3/22* (2006.01)

(52) U.S. Cl.
CPC ........ *H05K 1/09* (2013.01); *C23C 18/16* (2013.01); *C23C 18/1633* (2013.01); *C23C 18/36* (2013.01); *C23C 18/50* (2013.01); *H05K 1/028* (2013.01); *H05K 3/22* (2013.01); *H05K 3/244* (2013.01); *B05D 5/12* (2013.01); *H05K 2201/032* (2013.01)

(58) Field of Classification Search
USPC .............................. 427/99.5, 305, 438, 443.1
See application file for complete search history.

(56) References Cited

U.S. PATENT DOCUMENTS

| 4,122,215 A | 10/1978 | Vratny |
| 5,916,696 A * | 6/1999 | Abys et al. .................. 428/670 |
| 2009/0186240 A1* | 7/2009 | Sander et al. ................ 428/652 |
| 2010/0155108 A1 | 6/2010 | Lee et al. |

OTHER PUBLICATIONS

PCT/EP2013/051060; PCT International Search Report and Written Opinion of the International Searching Authority dated Jul. 8, 2013.

* cited by examiner

*Primary Examiner* — Brian K Talbot
(74) *Attorney, Agent, or Firm* — Renner, Otto, Boisselle & Sklar, LLP

(57) ABSTRACT

The present invention relates to a method for electroless deposition of a bendable nickel-phosphorous alloy layer onto flexible substrates such as flexible printed circuit boards and the like. The nickel-phosphorous alloy layer is deposited from an aqueous plating bath comprising nickel ions, hypophosphite ions, at least one complexing agent and a grain refining additive selected from the group consisting of formaldehyde and formaldehyde precursors. The nickel-phosphorous alloy layers obtained have a columnar microstructure oriented perpendicular to the flexible substrate and are sufficiently bendable.

11 Claims, 4 Drawing Sheets

METHOD FOR ELECTROLESS NICKEL-PHOSPHOROUS ALLOY DEPOSITION ONTO FLEXIBLE SUBSTRATES

The present application is a U.S. National Stage Application based on and claiming benefit and priority under 35 U.S.C. §371 of International Application No. PCT/EP2013/051060, filed 21 Jan. 2013, which in turn claims benefit of and priority to Chinese Application No. 12155801.9, filed 16 Feb. 2012, the entirety of each of which is hereby incorporated herein by reference.

FIELD OF THE INVENTION

The present invention relates to a method for electroless deposition of nickel-phosphorous alloys onto flexible substrates in the manufacture of printed circuit boards and the like.

BACKGROUND OF THE INVENTION

Layers of nickel-phosphorous alloys deposited by electroless plating are frequently used as a barrier layer between a copper surface and a solderable or wire bondable material such as a palladium and/or gold layer in the manufacture of printed circuit boards, IC substrates and the like. The barrier layer prevents or retards undesired diffusion between the copper surface of a copper circuitry or a copper contact area and the noble metal layer and furthermore provides corrosion protection to said copper surface. Electroless deposition of nickel-phosphorous alloys onto rigid substrates is a mature technology.

A more recent application for nickel-phosphorous alloy layers is as barrier layers on flexible substrates in the manufacture of flexible printed circuit boards and the like. Such flexible substrates comprise a dielectric base material foil of a polymer material and a copper circuitry attached thereon. Parts of the copper circuitry designated as contact areas need to be coated with a nickel-phosphorous alloy layer which again serves as a barrier layer between the copper circuitry and noble metal layers such as palladium and/or gold layers deposited onto the barrier layer. Here, the bendability of the nickel-phosphorous alloy layer is mandatory for reliability of the flexible printed circuit board or related devices.

Plating baths for deposition of nickel-phosphorous alloys conventionally used in the manufacture of rigid printed circuit boards and the like leads to nickel-phosphorous alloy layers which are prone to undesired crack formation when bending the coated flexible substrate.

A plating bath for deposition of nickel-phosphorous alloys comprising nickel ions, hypophosphite ions and an aminocarboxylic acid is disclosed in JP 2006-206985A. The nickel-phosphorous layers obtained are bendable and suited for deposition and use on flexible substrates. This plating bath is free of carboxylic acids without an amino residue since otherwise no bendable nickel-phosphorous alloy layer can be deposited from said plating bath.

An electroless plating bath comprising nickel ions, a reducing agent, a complexing agent and a vertical growth inducer (bismuth ions) is disclosed in US 2010/0155108 A1. Nickel-phosphorous alloy layers deposited onto flexible substrates from said plating bath are sufficiently bendable and suited for application in flexible printed circuit boards and the like. However, toxic heavy metal ions are required in the plating bath for deposition of bendable nickel-phosphorous alloy layers.

An electroless plating bath for deposition of nickel phosphorous alloys comprising urotropine is disclosed in SU 272761. Urotropine is used as a stabilising agent which improves the shelf life of the plating bath compared to similar plating bath compositions comprising thiourea as the stabilising agent.

An electroless plating bath for deposition of nickel-phosphorous alloys onto aluminium and aluminium alloys is disclosed in U.S. Pat. No. 4,122,215. Formaldehyde can be added to the plating bath as a stabilising agent.

OBJECTIVE OF THE INVENTION

It is the objective of the present invention to provide a method for electroless deposition of bendable nickel-phosphorous alloy layers on flexible substrates.

SUMMARY OF THE INVENTION

This objective is solved by a method for electroless deposition of a bendable nickel-phosphorous alloy layer onto a flexible substrate, comprising, in this order, the steps
 a. providing a flexible substrate having attached to at least one side a copper circuitry,
 b. contacting the flexible substrate with an aqueous plating bath comprising
   i. nickel ions,
   ii. hypophosphite ions,
   iii. at least one complexing agent and
   iv. a grain refining additive selected from the group consisting of formaldehyde and formaldehyde precursors,
and thereby depositing a bendable nickel-phosphorous alloy layer onto the copper circuitry attached to at least one side of the flexible substrate.

The sufficiently bendable nickel-phosphorous alloy layers can be deposited from an aqueous plating bath containing conventional complexing agents such as hydroxycarboxylic acids or salts thereof.

DETAILED DESCRIPTION OF THE INVENTION

Figure 1:
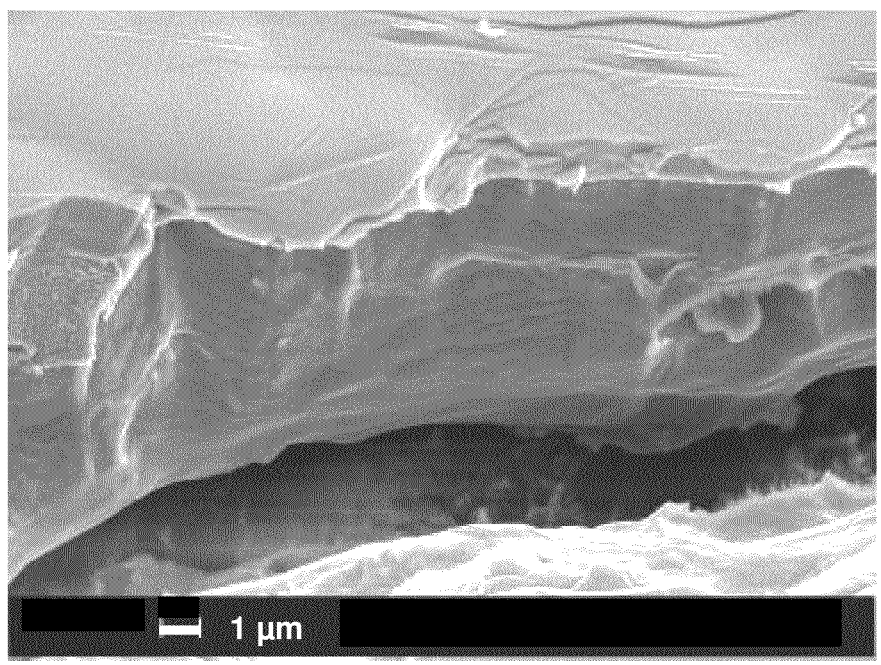
FIG. 1 shows the scanning electron micrograph of a fractured cross section of the nickel-phosphorous alloy layer obtained in comparative example 2.

Flexible printed circuit boards and the like comprise at least one dielectric base material foil and a copper circuitry on at least one side of said foil. The flexible base material foil is for example 12 to 125 μm thick and made of polymer materials such as polyimide, fluoropolymers such as Teflon®, epoxy-based composites or polyester such as PET. The copper circuitry may be formed by etching the desired circuitry pattern in a copper layer attached to the base material foil.

Flexible printed circuit boards and the like are used in products such as medical equipment, keyboards, hard disk drives, printers and cellular phones.

Selected areas of the copper circuitry are to be connected with other components by e.g. soldering or wire bonding. Hence, such areas need to be prepared by a) depositing a nickel-phosphorous alloy layer by electroless plating as a barrier layer thereon and b) depositing one or more noble metal layers, e.g., a palladium layer, a gold layer or a multi-layer consisting of a palladium layer and a gold layer onto the barrier layer in order to provide a solderable and/or wire bondable surface on the areas of the copper circuitry designated for connecting with other components.

The flexible substrate comprising on at least one side a copper circuitry is first cleaned, preferably with an aqueous acidic cleaner.

Next, the copper surface is microetched by e.g., immersing the substrate in an aqueous solution comprising sulfuric acid and an oxidising agent such as hydrogen peroxide.

The microetched copper surface is then activated. Usually, a palladium seed layer is immersion plated onto the copper surface, wherein the palladium ions are deposited onto the copper surface, reduced by copper to metallic state palladium and copper ions are released into the immersion plating bath. The copper surface is then composed of metallic palladium which serves as seeds for the following electroless nickel-phosphorous alloy plating.

All these pre-treatment procedures are known in the art.

Next, the flexible substrate is contacted with an aqueous plating bath for electroless deposition of a nickel-phosphorous alloy layer.

The aqueous plating bath composition used in the method according to the present invention comprises nickel ions added in the form of a water soluble nickel salt such as nickel sulfate, nickel acetate and nickel nitrate; hypophosphite ions as the reducing agent, added for example as sodium hypophosphite; at least one complexing agent and a grain-refining additive selected from formaldehyde and formaldehyde precursors.

The concentration of nickel ions preferably ranges from 1 to 18 g/l, more preferably from 3 to 9 g/l.

The reducing agent is selected from hypophosphite compounds such as hypophosphorous acid or a bath soluble salt thereof such as sodium hypophosphite, potassium hypophosphite and ammonium hypophosphite. The amount of the reducing agent employed in the plating bath preferably ranges from 2 to 60 g/l, more preferably from 12 to 50 g/l and most preferably from 20 to 45 g/l. As a conventional practice the reducing agent is replenished during the reaction.

The complexing agents are preferably employed in amounts of 1 to 200 g/l, more preferably from 15 to 75 g/l.

In one embodiment of the present invention, carboxylic acids, hydroxycarboxylic acids, aminocarboxylic acids or mixtures thereof are selected as complexing agents. Useful carboxylic acids include mono-, di-, tri- and tetra-carboxylic acids.

The complexing agents may be introduced into the aqueous plating bath as their sodium, potassium or ammonium salts. Some complexing agents such as acetic acid, for example, may also act as a buffering agent, and the appropriate concentration of such additive components can be optimised for any plating bath in consideration of their dual functionality.

Examples of such carboxylic acids which are useful as the complexing agents include: monocarboxylic acids such as acetic acid and dicarboxylic acids such as propanedioic acid and succinic acid; hydroxycarboxylic acids such as hydroxy-acetic acid, 2-hydroxy propanoic acid, lactic acid, tartaric acid, malic acid, 2-hydroxy-1,2,3 propane tricarboxylic acid, hydroxy succinic acid; aminocarboxylic acids such as aminoacetic acid, 2-amino propanoic acid, cysteine, amino succinic acid, and ethylenediaminetetraacetic acid (EDTA)

The most preferred complexing agents are selected from the group consisting of hydroxycarboxylic acids and aminocarboxylic acids.

In one embodiment of the present invention, mixtures of two or more of the above complexing agents are utilised, such as a hydroxycarboxylic acid and an aminocarboxylic acid or a combination of two or more different hydroxycarboxylic acids.

Since the aqueous plating bath has a tendency to become more acidic during its operation due to the formation of $H_3O^+$ ions, the pH may be periodically or continuously adjusted by adding bath-soluble and bath-compatible alkaline substances such as sodium, potassium or ammonium hydroxides, carbonates and bicarbonates. The stability of the operating pH of the aqueous plating bath can be improved by the addition of various buffer compounds such as acetic acid, propionic acid, boric acid, or the like, preferably in amounts of 1 to 30 g/l, more preferably from 2 to 10 g/l.

The aqueous plating bath further comprises a grain refining additive selected from the group consisting of formaldehyde and formaldehyde precursors.

A formaldehyde precursor is defined herein as a compound which decomposes in the aqueous plating bath and thereby forms formaldehyde. Suitable formaldehyde precursors are for example acetales, hemiacetales, aminales, and N,O-acetales.

In case formaldehyde is directly added to the aqueous plating bath it is then preferably added as an aqueous solution containing 35 to 37 wt.-% formaldehyde and optionally stabilisers for formaldehyde.

Acetales, hemiacetales, aminales, and N,O-acetales suitable as a formaldehyde precursor are for example dimethylol glycol, sodium hydroxymethylglycinat, 1,3-bis(hydroxymethyl)5,5-dimethylimidazolidine-2,4-dione, 1,3,5,7-tetraazatricyclo-[3.3.1.1$^{3.7}$]decane, benzylhemiformal, 2-bromo-2-nitropropane-1,3-diol, 5-bromo-5-nitro-1,3-dioxan, 1,3-bis(hydroxymethyl)-1-(1,3,4-tris(hydroxymethyl)-2,5-dioxoimidazolidin-4-yl)urea, 1,1'-methylenebis{3-[1-(hydroxymethyl)-2,5-dioxoimidazolidin-4-yl]urea}, 3,5,7-triaza-1-azoniatricyclo-[3.3.1.1$^{3.7}$]-decane-1-(3-chloro-2-propenyl)-chloride, tetramethylolglycoluril, 1,3-bis(hydroxymethyl)-2-imidazolidinone, 1,3-bis(hydroxymethyl)urea, 2,2,2-trichloroethane-1,1-diol, and 5,5-dimethyl-1,3-dioxane.

Most preferably, the grain refining additive is a formaldehyde precursor.

The main technical advantage of formaldehyde precursors compared to formaldehyde added in substance to the plating bath is a lower concentration of free formaldehyde in the plating bath. When free formaldehyde in the plating bath is consumed, further free formaldehyde is formed from the formaldehyde precursor present. In case formaldehyde is directly added to the plating bath a higher concentration of formaldehyde may be added to the plating bath compared to the amount of free formaldehyde in case a formaldehyde precursor is added to the plating bath instead. Because formaldehyde is a toxic substance, it is desired to keep the concentration of free formaldehyde in the plating bath at the lowest possible value while maintaining the beneficial technical effect of formaldehyde in respect to the bendability of nickel-phosphorous alloy layers deposited therefrom.

The concentration of the grain refining additive in the aqueous plating bath preferably ranges from 0.001 to 1.0 g/l, more preferably from 0.01 to 0.5 g/l.

Figure 2:
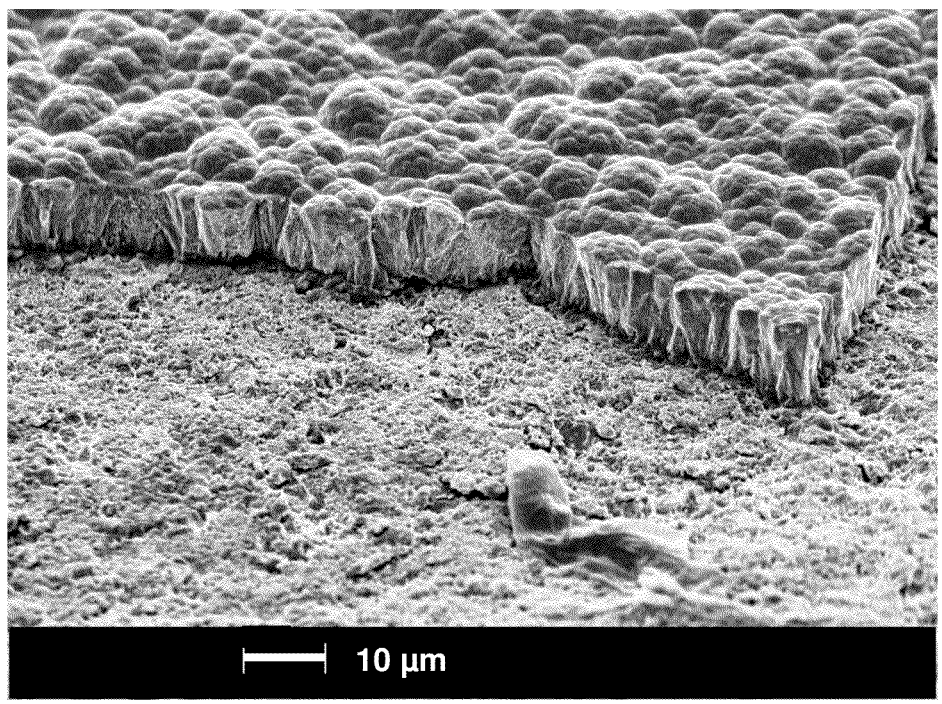
FIG. 2 shows the scanning electron micrograph of a fractured cross section of the nickel-phosphorous alloy layer obtained in example 5.
Figure 3:
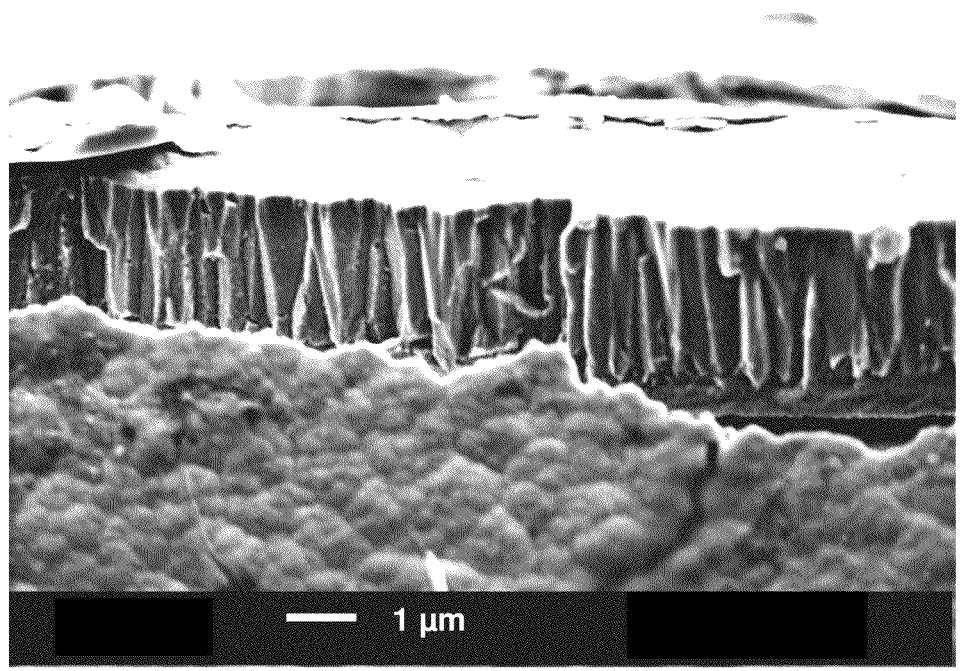
FIG. 3 shows the scanning electron micrograph of a fractured cross section of the nickel-phosphorous alloy layer obtained in example 6.

The presence of formaldehyde or a formaldehyde precursor in the aqueous plating bath leads to a columnar microstructure of the deposited nickel-phosphorous alloy layer which is oriented perpendicular to the surface of the flexible substrate (FIGS. 2 and 3). The columnar microstructure oriented perpendicular to the surface of the flexible substrate is essential for the improved bendability of the nickel phosphorous alloy layer. Here, only narrow cracks are formed in the nickel phosphorous alloy layer when bending which are acceptable.

Deep cracks running down to the substrate surface and/or copper circuitry are formed in nickel phosphorous alloy layers having no such anisotropic microstructure and hence, have an insufficient bendability (FIG. 1).

The aqueous plating bath may also include organic and/or inorganic stabilising agents of the types heretofore known in the art including lead ions, cadmium ions, tin ions, bismuth ions, antimony ions and zinc ions which can be conveniently introduced in the form of bath soluble and compatible salts such as the acetates, etc. Preferably, the plating bath does not contain toxic heavy metal ions such as lead ions, cadmium ions and bismuth ions. Organic stabilisers useful in the aqueous plating bath include sulfur-containing compounds such as, for example, thiourea, mercaptanes, thioethers, sulfur containing aminocarboxylic acids, sulfonates, thiocyanates, etc. The optional stabilisers are used in small amounts such as from 0.05 to 5 ppm of the plating bath, and more often in amounts of from 0.1 to 2 or 3 ppm.

Other materials may be included in the nickel plating solutions such as buffers and wetting agents. These materials are known in the art.

The nickel plating bath optionally contains one or more wetting agents of any of the various types heretofore known which are soluble and compatible with the other bath constituents. In one embodiment, the use of such wetting agents prevents or hinders pitting of the nickel-phosphorous alloy deposit, and the wetting agents can be employed in amounts up to about 1 g/l.

The pH value of the aqueous plating bath preferably ranges from 3 to 6, more preferably from 4.5 to 5.5.

The flexible substrate to be plated is contacted with the aqueous plating bath at a temperature of at least 40° C. up to 95° C. The electroless nickel plating baths according to the present invention are employed, in one embodiment, at a temperature of from 60° C. to 95° C., and more often, at a temperature of from 70° C. to 90° C.

The duration of contact of the electroless nickel plating bath with the flexible substrate being plated is a function which is dependent on the desired thickness of the nickel phosphorus alloy. Typically, the contact time can range from 1 to 60 min, more preferably from 5 to 45 min.

The resulting nickel-phosphorous alloy layer has a thickness in the range of 0.5 to 5 µm and a phosphorous content of 4 to 12 wt.-%.

The flexible substrate to be coated with a nickel-phosphorous alloy can be contacted with the plating bath according to the method of the present invention by dipping the flexible substrate into the plating bath or by spraying the plating bath onto the flexible substrate.

During deposition of the nickel phosphorous alloy, mild agitation may be employed.

Agitation may be a mild air agitation, mechanical agitation, bath circulation by pumping, movement of the flexible substrate, etc. The plating bath may also be subjected to a periodic or continuous filtration treatment to reduce the level of contaminants therein. Replenishment of the constituents of the plating bath may also be performed, in some embodiments, on a periodic or continuous basis to maintain the concentration of constituents, and in particular, the concentration of nickel ions and hypophosphite ions, as well as the pH level within the desired limits.

The invention will now be illustrated by reference to the following non-limiting examples.

EXAMPLES

Flexible Substrate Material

The flexible substrate material (polyimide foil, 25 µm thick) having a copper circuitry with an average thickness of 37 µm attached to both sides (schematically shown in FIG. 4) was cleaned with an acidic cleaner (Pro Select SF, a product of Atotech Deutschland GmbH, t=5 min, T=40° C.), micro-etched (Micro Etch SF, a product of Atotech Deutschland GmbH, t=2 min, T=30° C.) and activated by immersion plating of palladium (Aurotech® Activator 1000, a product of Atotech Deutschland GmbH, t=50 s, T=22° C.) prior to contacting the flexible substrate with an aqueous plating bath for deposition of the nickel-phosphorous alloy layer.

The flexible substrates coated with a nickel-phosphorous alloy layer were then investigated with a scanning electron microscope (SEM) after preparation of a fracture cross section of the respective sample.

Bending Test

Figure 4:
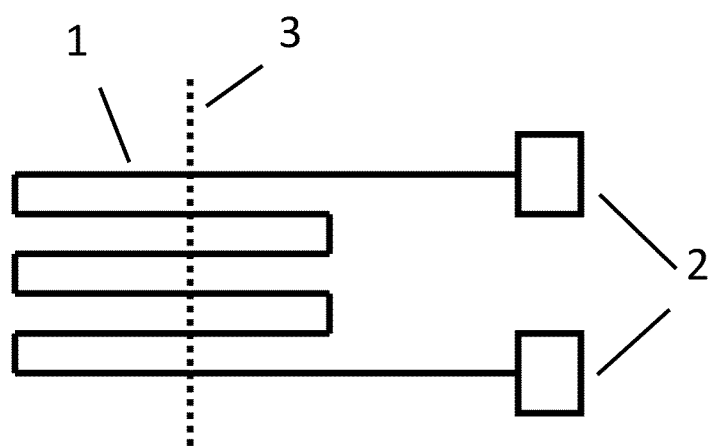
FIG. 4 shows schematically the copper circuitry on top of the flexible substrates used for the bending tests throughout examples 1 to 6.

Stripes of the flexible substrates (size: 12×2 cm) were subjected to a repeated bending test with a Folding Tester from the company Jinan Drick Instruments Co., Ltd. The copper circuitry 1 on top of the test stripes is schematically shown in FIG. 4. The line width and inter line distance of the copper circuitry was 100 µm. Contact pads 2 are used to electrically contact the test stripes with the Folding tester. The test stripes were then bended along the line 3 throughout all examples. A left-and-right bending angle of 135° at a bending rate of 175 rpm and a load of 500 g was applied. The curvature R of the bending clamp was 0.38 mm. The number of bending cycles was recorded until a short circuit indicating an undesired cracking of the nickel-phosphorous alloy layer was observed.

The results of the bending tests performed throughout examples 2 to 6 are summarized in Table 1.

Example 1

Blank Flexible Substrate without Nickel Phosphorous Alloy Layer

The flexible substrate material (polyimide foil) having a copper circuitry attached to both sides was subjected to a bending test as described above.

Short circuits in the test of the blank test substrate (no nickel-phosphorous alloy layer deposited onto the copper circuitry) were observed after 40-45 bending cycles which correspond to the bendability of the copper circuitry on the flexible substrate.

Example 2

Comparative

A nickel-phosphorous alloy layer having a phosphorous content of 11 wt.-% was deposited from an aqueous plating bath comprising 5 g/l nickel ions, 30 g/l hypophosphite ions, 20 g/l lactic acid, 5 g/l malic acid, (complexing agent) and 1 mg/l lead ions (stabilizer). The nickel-phosphorous alloy layer had a thickness of 3 μm.

A fracture cross section of the nickel-phosphorous alloy layer as deposited is shown in FIG. 1 (the scale bar represents 1 μm). The nickel-phosphorous alloy layer has a homogeneous and very fine microstructure without a visible preferred orientation.

Non acceptable cracks in the nickel-phosphorous alloy layer occurred after 1-2 bending cycles in the bending test.

Example 3

Comparative

A nickel-phosphorous alloy layer having a phosphorous content of 11 wt.-% was deposited from an aqueous plating bath comprising 5 g/l nickel ions, 30 g/l hypophosphite ions, 20 g/l lactic acid, 5 g/l malic acid, (complexing agent) and 1 mg/l bismuth ions (stabilizer). The nickel-phosphorous alloy layer had a thickness of 2.4 μm.

Non acceptable cracks in the nickel-phosphorous alloy layer occurred after 1 bending cycle in the bending test.

Example 4

Comparative

A nickel-phosphorous alloy layer having a phosphorous content of 9 wt.-% was deposited from an aqueous plating bath comprising 5 g/l nickel ions, 30 g/l hypophosphite ions, 20 g/l lactic acid, 5 g/l malic acid, (complexing agent) and 1 mg/l mercaptobenzothiazole (first stabilizer) and 1 m/g bismuth ions (second stabilizer) according to US 2010/0155108 A1. The nickel-phosphorous alloy layer had a thickness of 2.6 μm.

Non acceptable cracks in the nickel-phosphorous alloy layer occurred after 2 bending cycles in the bending test.

Example 5

A nickel-phosphorous alloy layer having a phosphorous content of 12 wt.-% was deposited from an aqueous plating bath comprising 5 g/l nickel ions, 30 g/l hypophosphite ions, 20 g/l lactic acid, 5 g/l malic acid, (complexing agent), 1 mg/l lead ions (stabilizer) and 0.3 g/l of a formaline solution comprising 37 wt.-% formaldehyde (grain refining additive). The nickel-phosphorous alloy layer had a thickness of 3 μm.

A fracture cross section of the nickel-phosphorous alloy layer as deposited is shown in FIG. 2 (the scale bar represents 10 μm). The nickel-phosphorous alloy layer has a columnar microstructure oriented perpendicular to the surface of the flexible substrate.

Non acceptable cracks in the nickel-phosphorous alloy layer only occurred after 30 bending cycles in the bending test.

Example 6

A nickel-phosphorous alloy layer having a phosphorous content of 11 wt.-% was deposited from an aqueous plating bath comprising 5 g/l nickel ions, 30 g/l hypophosphite ions, 20 g/l lactic acid, 5 g/l malic acid, (complexing agent), 1 mg/l lead ions (stabilizer) and 0.3 g/l urotropine (grain refining additive). The nickel-phosphorous alloy layer had a thickness of 3 μm.

A fracture cross section of the nickel-phosphorous alloy layer as deposited is shown in FIG. 3 (the scale bar represents 1 μm). The nickel-phosphorous alloy layer has a columnar microstructure oriented perpendicular to the surface of the flexible substrate.

Non acceptable cracks in the nickel-phosphorous alloy layer only occurred after 30 bending cycles in the bending test.

TABLE 1

Results from bending test for examples 1 to 6.

| Example No. | bending cycles until short circuit |
| --- | --- |
| 2 (comparative) | 1-2 |
| 3 (comparative) | 1 |
| 4 (comparative) | 2 |
| 5 | 30 |
| 6 | 30 |

The invention claimed is:

1. A method for electroless deposition of a bendable nickel-phosphorous alloy layer onto a flexible substrate, comprising, in this order, the steps
   i. providing a flexible substrate having attached to at least one side a copper circuitry,
   ii. contacting the flexible substrate with an aqueous plating bath comprising
      1. nickel ions,
      2. hypophosphite ions,
      3. at least one complexing agent and
      4. a grain refining additive selected from the group consisting of formaldehyde and formaldehyde precursors,
wherein the contacting deposits the bendable nickel-phosphorous alloy layer onto the copper circuitry attached to at least one side of the flexible substrate.

2. The method for electroless deposition of a bendable nickel-phosphorous alloy layer according to claim 1 wherein the flexible substrate is a flexible printed circuit board.

3. The method for electroless deposition of a bendable nickel-phosphorous alloy layer according to claim 1 wherein the concentration of nickel ions in the aqueous plating bath ranges from 1 to 18 g/l.

4. The method for electroless deposition of a bendable nickel-phosphorous alloy layer according to claim 1 the concentration of hypophosphite ions ranges from 2 to 60 g/l.

5. The method for electroless deposition of a bendable nickel-phosphorous alloy layer according to claim 1 wherein the concentration of the at least one complexing agent ranges from 1 to 200 g/l.

6. The method for electroless deposition of a bendable nickel-phosphorous alloy layer according to claim 1 wherein the at least one complexing agent is selected from the group consisting of carboxylic acids, hydroxycarboxylic acids, and aminocarboxylic acids.

7. The method for electroless deposition of a bendable nickel-phosphorous alloy layer according to claim 1 wherein the concentration of the grain refining additive ranges from 0.001 to 1.0 g/l.

8. The method for electroless deposition of a bendable nickel-phosphorous alloy layer according to claim 1 wherein the formaldehyde precursor is selected from the group consisting of acetals, hemiacetals, aminals, and N,O-acetals.

9. The method for electroless deposition of a bendable nickel-phosphorous alloy layer according to claim 1 wherein the formaldehyde precursor is selected from the group consisting of dimethylol glycol, sodium hydroxymethylglycinate, 1,3-bis(hydroxymethyl) 5,5-dimethyl-imidazolidine-2,4-dione, 1,3,5,7-tetraazatricyclo[3.3.1.1$^{3,7}$]decane, benzylhemiformal, 2-bromo-2-nitropropane-1,3-diol, 5-bromo-5-nitro-1,3-dioxane, 1,3-bis(hydroxyl-methyl)-1-(1,3,4-tris(hydroxymethyl)-2,5-dioxoimidazolidin-4-yl) urea, 1,1'-methylenebis{3-[1-(hydroxymethyl)-2,5-dioxoimidazolidin-4-yl]-urea}, 3,5,7-triaza-1-azoniatricyclo-[3.3.1.1$^{3,7}$]-decane-1-(3-chloro-2-propenyl)-chloride, tetramethylolglycoluril, 1,3-bis(hydroxymethyl)2-imidazolidinone, 1,3-bis(hydroxyl-methyl)urea, 2,2,2-trichloroethane-1,1-diol, and 5,5-dimethyl-1,3-dioxane.

10. The method for electroless deposition of a bendable nickel-phosphorous alloy layer according to claim 1 wherein the aqueous plating bath is held at a temperature between 40 and 95° C. during deposition of the nickel-phosphorous alloy.

11. The method for electroless deposition of a bendable nickel-phosphorous alloy layer according to claim 1 wherein the flexible substrate is contacted with the aqueous plating bath for 1 to 60 min.

* * * * *